United States Patent
Lee et al.

(10) Patent No.: US 8,680,841 B2
(45) Date of Patent: Mar. 25, 2014

(54) REFERENCE VOLTAGE GENERATION CIRCUITARY FOR SEMICONDUCTOR APPARATUS AND METHOD FOR CHECKING A REFERENCE VOLTAGE

(75) Inventors: Jeong Hun Lee, Icheon-si (KR); Yong Mi Kim, Icheon-si (KR); Jeong Tae Hwang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 567 days.

(21) Appl. No.: 12/983,090

(22) Filed: Dec. 31, 2010

(65) Prior Publication Data
US 2012/0081100 A1    Apr. 5, 2012

(30) Foreign Application Priority Data
Sep. 30, 2010 (KR) .................. 10-2010-0095641

(51) Int. Cl.
G05F 1/607    (2006.01)
G05F 1/614    (2006.01)

(52) U.S. Cl.
USPC ........................ 323/314; 323/283

(58) Field of Classification Search
USPC ................. 323/312–317, 282–285
See application file for complete search history.

(56) References Cited

U.S. PATENT DOCUMENTS

| | | | |
|---|---|---|---|
| 6,115,298 A | 9/2000 | Kwon et al. | |
| 6,166,589 A | 12/2000 | Park | |
| 6,429,641 B1* | 8/2002 | Montrose | 324/123 C |
| 7,034,567 B2 | 4/2006 | Jang | |
| 7,138,790 B2* | 11/2006 | Hackner et al. | 323/282 |
| 7,456,621 B2* | 11/2008 | Leung et al. | 323/283 |
| 7,960,951 B2* | 6/2011 | Southwell et al. | 323/272 |
| 7,990,122 B2* | 8/2011 | Sase et al. | 323/283 |
| 2004/0189343 A1 | 9/2004 | Jang | |
| 2006/0001408 A1* | 1/2006 | Southwell et al. | 323/282 |
| 2008/0012596 A1 | 1/2008 | Lewison et al. | |

FOREIGN PATENT DOCUMENTS

| | | |
|---|---|---|
| KR | 1020080081386 A | 9/2008 |
| KR | 1020080092509 A | 10/2008 |

* cited by examiner

*Primary Examiner* — Adolf Berhane
*Assistant Examiner* — Nusrat Quddus
(74) *Attorney, Agent, or Firm* — William Park & Associates Patent Ltd.

(57) ABSTRACT

A semiconductor apparatus includes a comparison voltage generation unit configured to generate a plurality of different comparison voltages, a reference voltage generation unit configured to receive a generation code from an external system, select one of the plurality of the different comparison voltages according to the generation code, and generate a reference voltage, and a reference voltage determination unit configured to receive the generation code and an expected reference voltage from the external system, check whether a level of the expected reference voltage is in a target range, and output a check result to the external system.

11 Claims, 4 Drawing Sheets

US 8,680,841 B2

REFERENCE VOLTAGE GENERATION CIRCUITARY FOR SEMICONDUCTOR APPARATUS AND METHOD FOR CHECKING A REFERENCE VOLTAGE

CROSS-REFERENCES TO RELATED APPLICATION

The present application claims priority under 35 U.S.C. §119(a) to Korean application number 10-2010-0095641, filed on Sep. 30, 2010, in the Korean Intellectual Property Office, which is incorporated herein by reference in its entirety.

BACKGROUND

1. Technical Field

The present invention relates to voltage generation circuitry for a semiconductor apparatus.

2. Related Art

A semiconductor apparatus, specifically, a semiconductor memory apparatus, generates an internal voltage from an external voltage applied from an outside of the semiconductor memory apparatus and uses the internal voltage as a voltage supply source of internal circuits within a chip in order to perform a low power operation and a stable operation. In order to generate the internal voltage at an accurate level, a reference voltage serving as a reference for voltage generation is generated from the external voltage, and the internal voltage is generated using the reference voltage.

As described above, the reference voltage serves as a reference for generating the internal voltage. Accordingly, an external system inputs a generation code of plural bits (e.g., 6 bits) to the semiconductor apparatus, evaluates the characteristics of the semiconductor apparatus, which are represented by input parameters including Setup and Hold time, by changing the generation code from the minimum value to the maximum value, and decides a generation code representing optimal operation characteristics. An operation, in which the reference voltage is generated by changing the generation code from the minimum value to the maximum value and the generation code representing optimal operation characteristics is decided, is called reference voltage training. The generation code is inputted using plural bits of a mode register set signal in the case of a semiconductor apparatus such as a dynamic random access memory (DRAM).

However, the reference voltage generated in the semiconductor apparatus may deviate from a target value due to operation noise, coupling effect, power noise, and reduction in shielding force with peripheral lines. If the reference voltage generated in the semiconductor apparatus deviates from the target value, internal voltage value of the semiconductor apparatus may deviate from the target value, and operation characteristics may deteriorate. However, since an external system decides the generation code using the reference voltage training and fixes the generation code, it may be difficult to detect that the reference voltage deviates from the target value. Since the reference voltage is increasingly unstable with the development of a semiconductor apparatus, it is more difficult to generate a stable reference voltage

SUMMARY

In one embodiment of the present invention, a semiconductor apparatus includes: a comparison voltage generation unit configured to generate a plurality of different comparison voltages; a reference voltage generation unit configured to receive a generation code from an external system, select one of the plurality of the different comparison voltages according to the generation code, and generate a reference voltage; and a reference voltage determination unit configured to receive the generation code and an expected reference voltage from the external system, check whether a level of the expected reference voltage is in a target range, and output a check result to the external system.

In another embodiment of the present invention, a method for checking a reference voltage includes transmitting a generation code and an expected reference voltage from a first device to a second device; generating by the second device a reference voltage according to the generation code; comparing by the second device the expected reference voltage with the reference voltage; and transmitting a comparison result from the second device to the first device.

BRIEF DESCRIPTION OF THE DRAWINGS

Features, aspects, and embodiments are described in conjunction with the attached drawings, in which.

DETAILED DESCRIPTION

A semiconductor apparatus according to an embodiment of the present invention receives an expected reference voltage and a generation code from an external system, checks whether the level of the expected reference voltage is in a specific range (hereinafter, referred to as a target range) of a reference voltage generated in the semiconductor apparatus, and outputs a check result to the external system. If the external system recognizes the accuracy of the reference voltage generated in the semiconductor apparatus, it is possible to improve the operation capacity of the system and the semiconductor apparatus by adjusting driving force of an output driver of the system, adjusting input parameters of signals inputted to the semiconductor apparatus, and the like. The external system may generate the expected reference voltage corresponding to the generation code, input the expected reference voltage to the semiconductor apparatus, and check whether the semiconductor apparatus normally generates the reference voltage based on the check result feedback from the semiconductor apparatus. In brief, a method for checking the reference voltage according to the embodiment of the present invention may include the steps of receiving a generation code and an expected reference voltage from an external system (or a master 700 in FIG. 1) by a semiconductor apparatus (or a slave 10 in FIG. 1), generating by the semiconductor apparatus a reference voltage according to the generation code, comparing by the semiconductor apparatus the reference voltage with the expected reference voltage, and transmitting by the semiconductor apparatus a comparison result to the external system.

Figure 1:
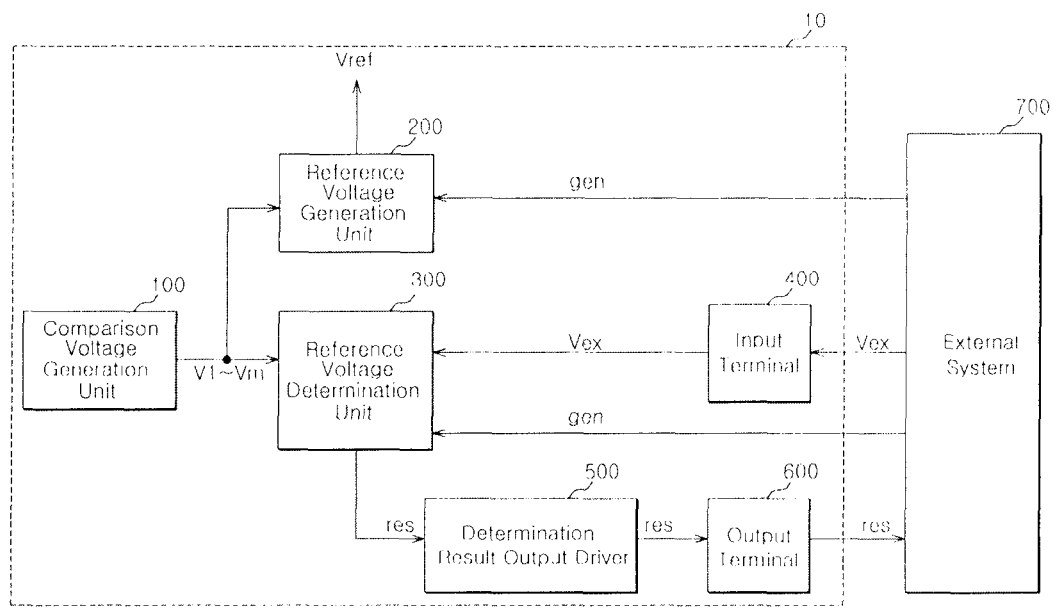
FIG. 1 is a schematic block diagram of a semiconductor apparatus according to an embodiment of the present invention.

FIG. 1 is a schematic block diagram of the semiconductor apparatus according to an embodiment of the invention.

The semiconductor apparatus according to the embodiment of the invention includes a comparison voltage generation unit 100, a reference voltage generation unit 200, and a reference voltage determination unit 300.

The comparison voltage generation unit 100 is configured to generate a plurality of comparison voltages with levels different from one another. For the purpose of convenience, it is assumed that the number of the comparison voltages is m (V1 to Vm) which is an integer larger than 3. The comparison voltage generation unit 100 may include, for example, a voltage divider having a plurality of serially connected resistors.

The reference voltage generation unit 200 is configured to receive a generation code gen of plural bits (e.g., 6 bits) from the external system 700, select one of the plurality of the comparison voltages V1 to Vm according to the generation code gen, and generate a reference voltage Vref. The reference voltage Vref serves as a reference for generating various internal voltages of the semiconductor apparatus. The reference voltage generation unit 200 may include a general multiplexer circuit.

The reference voltage determination unit 300 is configured to receive the generation code gen and an expected reference voltage Vex from the external system 700, check whether the level of the expected reference voltage Vex is in a target range, and output a check result (hereinafter, referred to as a determination signal) to the external system 700. For example, when it is assumed that the reference voltage generation unit 200 selects an $n^{th}$ comparison voltage Vn (n is an integer which larger than 2 and smaller than m) from the plurality of the comparison voltages V1 to Vm in response to the generation code gen, the reference voltage determination unit 300 may select an $(n+1)^{th}$ comparison voltage Vn+1 and an $(n-1)^{th}$ comparison voltage Vn-1 from the plurality of the comparison voltages V1 to Vm in response to the generation code gen, and check whether the level of the expected reference voltage Vex exists between the $(n+1)^{th}$ comparison voltage Vn+1 and the $(n-1)^{th}$ comparison voltage Vn-1. As mentioned above, due to load of various circuits using operation noise, coupling effect, power noise, shielding force with peripheral lines and the like, the reference voltage Vref may deviate from a target value. Such noise for the reference voltage Vref is also applied to the plurality of the comparison voltages V1 to Vm in the same manner. Accordingly, if it is checked whether the level of the expected reference voltage Vex exists between the $(n+1)^{th}$ comparison voltage Vn+1 and the $(n-1)^{th}$ comparison voltage Vn-1, it is possible to check whether the reference voltage Vref deviates from the target value. The expected reference voltage Vex is received from the external system 700, where the external system 700 generates the expected reference voltage Vex having a level corresponding to the generation code gen.

As illustrated in FIG. 1, the semiconductor apparatus according to the embodiment of the invention may further include an input terminal 400 which receives the expected reference voltage Vex from the external system 700. Furthermore, the semiconductor apparatus may further include an output terminal 600 that transmits to the external system 700, and a determination result output driver 500 which receives the determination signal res outputted by the reference voltage determination unit 300 and outputs the determination signal res to the output terminal 600. The determination result output driver 500 may include a general output buffer circuit.

Figure 2:
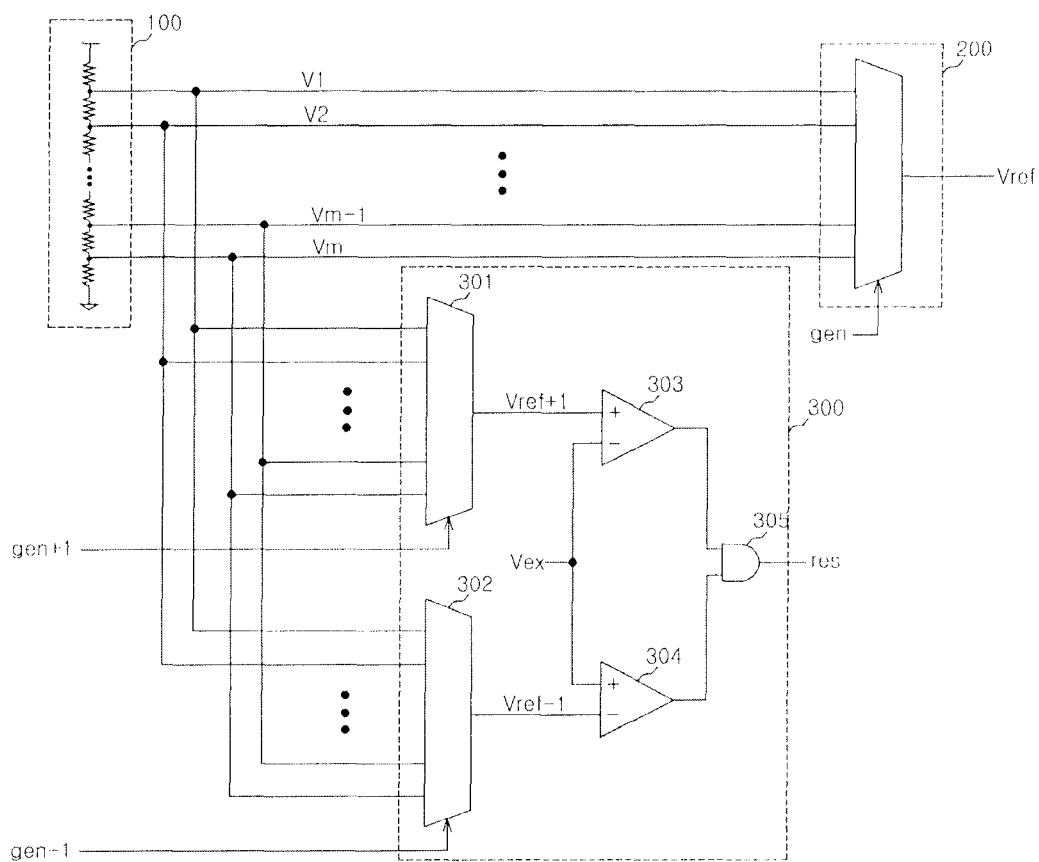
FIG. 2 is a circuit diagram of the comparison voltage generation unit, the reference voltage generation unit, and the reference voltage determination unit illustrated in FIG. 1 according to an embodiment.

FIG. 2 is a circuit diagram of the comparison voltage generation unit 100, the reference voltage generation unit 200, and the reference voltage determination unit 300 illustrated in FIG. 1 according to the embodiment.

As illustrated in FIG. 2, the comparison voltage generation unit 100 may include a voltage divider having a plurality of serially connected resistors. Since the comparison voltage generation unit 100 generates the plurality of (e.g., m) the comparison voltages V1 to Vm, m or more resistors may be serially connected between an external voltage VDD and a ground voltage VSS, and voltage levels among respective resistor terminals may be outputted as the plurality of the comparison voltages V1 to Vm.

As illustrated in FIG. 2, the reference voltage generation unit 200 may include a multiplexer circuit which selects one of the plurality of the comparison voltages V1 to Vm according to the generation code gen, and outputs the selected voltage as the reference voltage Vref.

As illustrated in FIG. 2, the reference voltage determination unit 300 may include a first multiplexer circuit 301, a second multiplexer circuit 302, a first comparator 303, a second comparator 304, and an AND gate 305.

The first multiplexer circuit 301 is configured to select one of the plurality of the comparison voltages V1 to Vm, which corresponds to a value (gen+1) obtained by adding 1 to the generation code gen, and output the value as a first comparison voltage Vref+1. As illustrated in FIG. 2, the first multiplexer circuit 301 may be configured to receive the value (gen+1) obtained by adding 1 to the generation code gen, or receive the generation code gen and generate the value (gen+1) obtained by adding 1 to the generation code gen. In order to facilitate the understanding of the embodiment of the invention, FIG. 2 illustrates an example in which the first multiplexer circuit 301 receive and uses the value (gen+1) obtained by adding 1 to the generation code gen. However, it should be noted that the example is not limited to adding by one for realizing the invention.

The second multiplexer circuit 302 is configured to select one of the plurality of the comparison voltages V1 to Vm, which corresponds to a value (gen-1) obtained by subtracting 1 from the generation code gen, and output the value as a second comparison voltage Vref-1. For example, if the reference voltage generation unit 200 has selected the $n^{th}$ comparison voltage Vn (n is an integer which larger than 2 and smaller than m) from the m comparison voltages V1 to Vm and generated the reference voltage Vref, the first multiplexer circuit 301 selects the $(n+1)^{th}$ comparison voltage Vn+1 to generate the first comparison voltage Vref+1, and the second multiplexer circuit 302 selects the $(n-1)^{th}$ comparison voltage Vn-1 to generate the second comparison voltage Vref-1.

The first comparator 303 is configured to receive the first comparison voltage Vref+1 and the expected reference voltage Vex, and the second comparator 304 is configured to receive the second comparison voltage Vref-1 and the expected reference voltage Vex. The first comparator 303 is configured to output a high level when the first comparison voltage Vref+1 is larger than the expected reference voltage Vex, and the second comparator 304 is configured to output a low level when the second comparison voltage Vref-1 is smaller than the expected reference voltage Vex.

The AND gate 305 is configured to receive and perform an AND operation on the output of the first comparator 303 and the output of the second comparator 304, and output the determination signal res. Accordingly, when the level of the expected reference voltage Vex exists between the first comparison voltage Vref+1 and the second comparison voltage Vref-1, the first comparator 303, the second comparator 304 and the AND gate 305 operate to output the determination signal res by activating it to a high level. When the level of the expected reference voltage Vex does not exist between the first comparison voltage Vref+1 and the second comparison voltage Vref−1, the first comparator 303, the second comparator 304 and the AND gate 305 operate to output the determination signal res by deactivating it to a low level. The AND gate 305 may include other logic operation circuits other than the AND operation circuit used with the configuration of the first comparator 303 and the second comparator 304. It should be noted that the configuration of the AND gate 305 illustrated in FIG. 2 is not limited to a specific logic operation for realizing the invention. Nor are the inputs to the AND gate 305 limited to the configuration of the first comparator 303 and the second comparator 304.

As illustrated in FIG. 1, in order to realize the semiconductor apparatus according to the embodiment of the invention, it may be useful to additionally provide to the input terminal 400 the expected reference voltage Vex received from the external system 700, and the determination result output driver 500 and the output terminal 60 through which the determination signal res is to be outputted. Since such a configuration may occupy an additional area of the semiconductor apparatus, and specifically the input terminal 400 and the output terminal 600 may be limited by the product standard of the semiconductor apparatus, it may not be easy to add the input terminal 400 and the output terminal 600 to the semiconductor apparatus in order to realize an embodiment of the invention. In this regard, the input terminal 400, the determination result output driver 500, and the output terminal 600 may be used by various embodiments of the invention by sharing the existing input/output terminals and output driver. More detailed description will be given with reference to FIG. 3.

Figure 3:
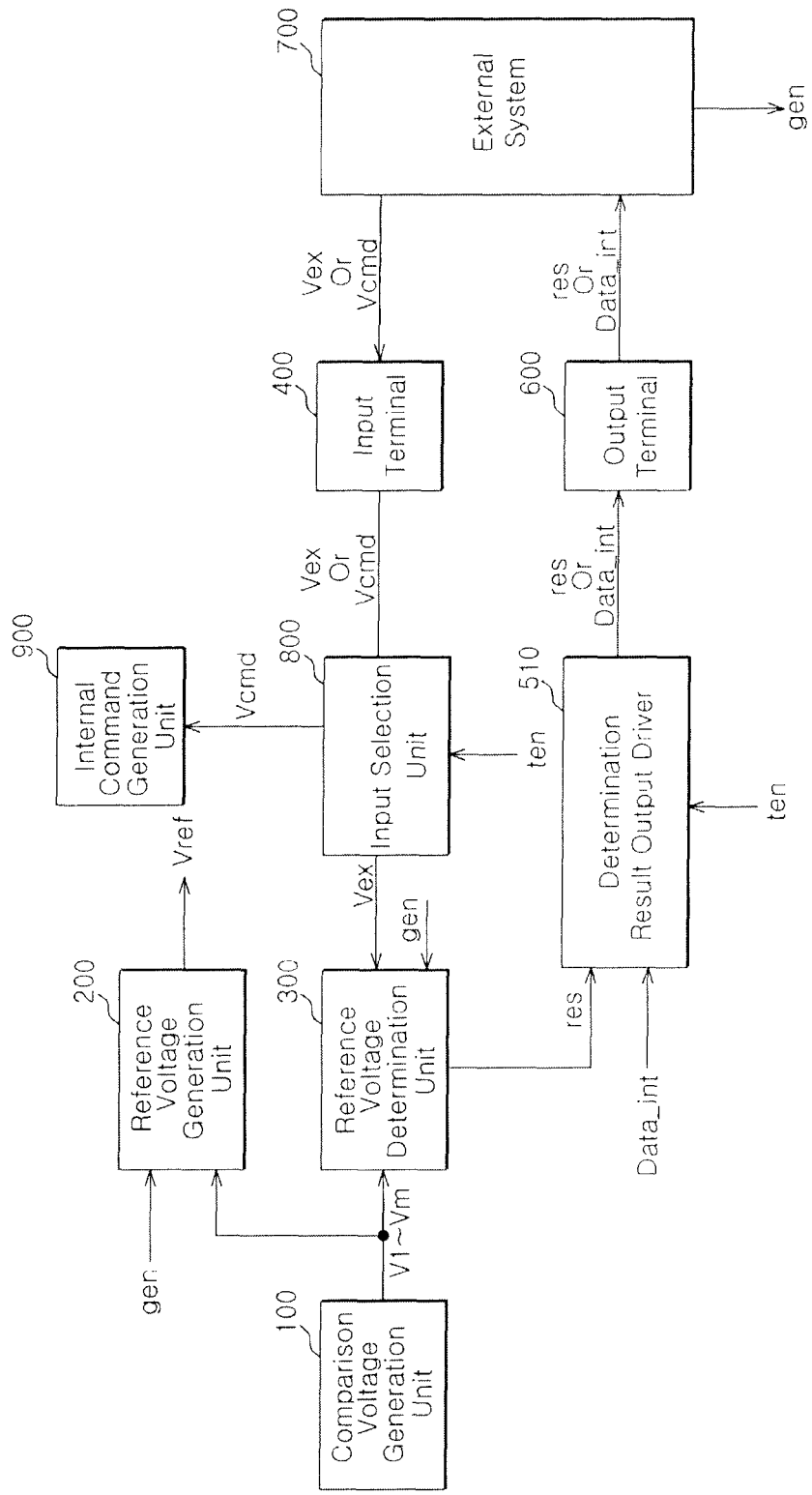
FIG. 3 is a schematic block diagram of a semiconductor apparatus according to another embodiment of the present invention.

FIG. 3 is a schematic block diagram of a semiconductor apparatus according to another embodiment of the invention.

Referring to FIG. 3, in order to share the existing input/output terminals and output driver as mentioned above, an input selection unit 800 and an internal command generation unit 900 are additionally provided and a determination result output driver 510 has a configuration different from that illustrated in FIG. 2.

When considering an input path to the semiconductor apparatus from the external system 700, the semiconductor apparatus illustrated in FIG. 3 uses the input terminal 400 to receive a reference voltage Vcmd for command. The reference voltage Vcmd for command is a voltage, which is received in the semiconductor apparatus from the external system 700, is inputted to the internal command generation unit 900 of the semiconductor apparatus, and serves as a reference for generating internal commands (e.g., CAS, LAS, address signals and the like) of the semiconductor apparatus. Since the reference voltage Vcmd for command is not continuously inputted, the input terminal 400 of the semiconductor apparatus can be used to receive other signals according to another embodiment of the invention. The input selection unit 800 is configured to transfer the expected reference voltage Vex or the reference voltage Vcmd for command, which is inputted to the input terminal 400, to the reference voltage determination unit 300 or the internal command generation unit 900 in response to a test enable signal ten. The input selection unit 800 may include a plurality of pass gates which receive the test enable signal ten. As described above, the semiconductor apparatus illustrated in FIG. 3 according to an embodiment of the invention may receive the expected reference voltage Vex or the reference voltage Vcmd for command by using the input terminal 400, and transfer the expected reference voltage Vex or the reference voltage Vcmd for command, via the input selection unit 800, to the reference voltage determination unit 300 or the internal command generation unit 900. The test enable signal ten is a signal for controlling the operation of the semiconductor apparatus according to an embodiment of the invention for checking whether the expected reference voltage Vex is in a target range, and may use a test mode signal.

When considering an output path to the external system 700 from the semiconductor apparatus, the semiconductor apparatus illustrated in FIG. 3 uses the output terminal 600 to output internal data Data_int. The internal data Data_int may be outputfrom the semiconductor apparatus to the external system 700, and the data may be data that was stored in a storage cell in the case of a semiconductor memory apparatus. In the case of a semiconductor memory apparatus such as a DRAM, the output terminal 600 may include a data pad for data input/output. The determination result output driver 510 is configured to output one of the internal data Data_int and the determination signal res to the output terminal 600 in response to the test enable signal ten. As described above, the semiconductor apparatus illustrated in FIG. 3 according to another embodiment of the invention may output the internal data Data_int or the determination signal res by using the output terminal 600, and output one of the internal data Data_int and the determination signal res to the output terminal 600 through the determination result output driver 510 in response to the test enable signal ten.

Figure 4:
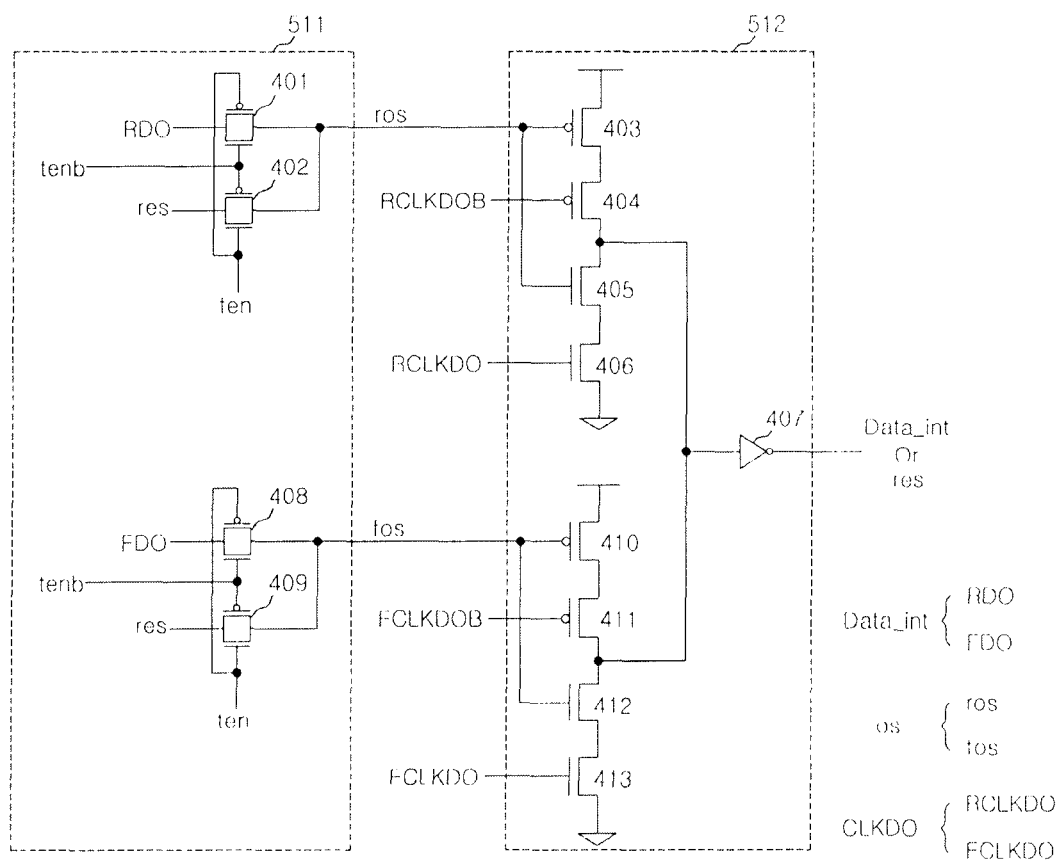
FIG. 4 is a circuit diagram of the determination result output driver illustrated in FIG. 3 according to an embodiment.

FIG. 4 is a circuit diagram of the determination result output driver 510 illustrated in FIG. 3 according to the embodiment. The determination result output driver 510 may include an output selection section 511 and an output section 512. The output selection section 511 is configured to output one of the determination signal res and the internal data Data_int as an output source signal os in response to the test enable signal ten. The output section 512 is configured to output the output source signal os to the output terminal 600 in response to a clock signal CLKDO. The determination result output driver 510 illustrated in FIG. 4 may be configured by employing a DDR (double data rate) output driver. The clock signal CLKDO for output includes a first clock RCLKDO and a second clock FCLKDO which are alternately activated. The internal data Data_int includes first data RDO corresponding to the first clock RCLKDO and second data FDO corresponding to the second clock FCLKDO. The output source signal os includes a first output source signal ros corresponding to the first clock RCLKDO and a second output source signal fos corresponding to the second clock FCLKDO. The determination result output driver 510 is configured to output the internal data Data_int by outputting the first data RDO and the second data FDO when the test enable signal ten is deactivated, and output the determination signal res when the test enable signal ten is activated.

The output selection section 511 may include first to fourth pass gates 401, 402, 408 and 409. The first pass gate 401 and the second pass gate 402 are serially connected to each other to receive the first data RDO and the determination signal res. The first pass gate 401 is configured to be activated to allow the first data RDO to pass therethrough when the test enable signal ten is deactivated to a low level. The second pass gate 402 is configured to be activated to allow the determination signal res to pass therethrough when the test enable signal ten is activated to a high level. The output terminals of the first pass gate 401 and the second pass gate 402 are connected to each other to output the first data RDO or the determination signal res as the first output source signal ros in response to the test enable signal ten.

The output section 512 may include first to fourth PMOS transistors 403, 404, 410 and 411, first to fourth NMOS transistors 405, 406, 412 and 413, and an inverter 407. The first PMOS transistor 403, the second PMOS transistor 404, the first NMOS transistor 405, and the second NMOS transistor 406 are serially connected to each other. The first PMOS transistor 403 and the first NMOS transistor 405 are configured to receive the first output source signal ros which is the common output of the first pass gate 401 and the second pass gate 402. The second PMOS transistor 404 is configured to receive an inversion signal of the first clock RCLKDO and the second NMOS transistor 406 is configured to receive the first clock RCLKDO. The second PMOS transistor 404 and the second NMOS transistor 406 are configured to be turned on when the first clock RCLKDO is activated to a high level. A voltage of a common node of the second PMOS transistor 404 and the first NMOS transistor 405 is transferred to the inverter 407. When the second PMOS transistor 404 and the second NMOS transistor 406 are turned on, the first PMOS transistor 403 and the first NMOS transistor 405 invert the first output source signal ros inputted according to the test enable signal ten, and output an inverted signal to the inverter 407. The inverter 407 is configured to invert an inputted signal and output an inverted signal to the output terminal 600.

The third and fourth pass gates 408 and 409, the third and fourth PMOS transistors 410 and 411, and the third and fourth NMOS transistors 412 and 413 are connected to each other in the same configuration as those of the first and second pass gates 401 and 402, the first and second PMOS transistors 403 and 404, and the first and second NMOS transistors 405 and 406. Accordingly, detailed description thereof will be omitted. In brief, when the test enable signal ten is activated to the high level, the pass gates 401 and 408 are blocked and the pass gates 402 and 409 are opened, so that the determination signal res is outputted at the activation timing of the first clock RCLKDO and the activation timing of the second clock FCLKDO which is activated alternately with respect to the first clock RCLKDO. That is, the determination result output driver 510 is configured to output the determination signal res to the output terminal 600 when the test enable signal ten is activated. Meanwhile, when the test enable signal ten is deactivated to the low level, the pass gates 401 and 408 are opened and the pass gates 402 and 409 are blocked, so that the first data RDO is outputted at the activation timing of the first clock RCLKDO and the second data FDO is outputted at the activation timing of the second clock FCLKDO, which is activated alternately with respect to the first clock RCLKDO, resulting in the output of the internal data Data_int. That is, the determination result output driver 510 is configured to output the internal data Data_int to the output terminal 600 when the test enable signal ten is activated.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
   a comparison voltage generation unit configured to generate a plurality of different comparison voltages;
   a reference voltage generation unit configured to receive a generation code from an external system, select one of the plurality of the comparison voltages according to the generation code, and generate a reference voltage; and
   a reference voltage determination unit configured to receive the generation code and an expected reference voltage from the external system, check whether a level of the expected reference voltage is in a target range, and output a check result to the external system,
   wherein the reference voltage determination unit is configured to select two of the plurality of the different comparison voltages in response to the generation code to set the target range, and check whether the level of the expected reference voltage is between the levels of the two comparison voltages.

2. The semiconductor apparatus according to claim 1, wherein the two comparison voltages selected by the reference voltage determination unit are a minimum comparison voltage, which is larger than the comparison voltage selected from the plurality of the different comparison voltages by the reference voltage generation unit, and a maximum comparison voltage which is smaller than the comparison voltage selected by the reference voltage generation unit.

3. The semiconductor apparatus according to claim 1, wherein the reference voltage determination unit comprises:
   a first multiplexer circuit configured to select one of the plurality of the different comparison voltages, which corresponds to a value obtained by adding 1 to the generation code, and output the value as a first comparison voltage;
   a second multiplexer circuit configured to select one of the plurality of the different comparison voltages, which corresponds to a value obtained by subtracting 1 from the generation code, and output the value as a second comparison voltage;
   a first comparator configured to receive the first comparison voltage and the expected reference voltage;
   a second comparator configured to receive the second comparison voltage and the expected reference voltage; and
   a logic operation section configured to receive output of the first comparator and output of the second comparator.

4. The semiconductor apparatus according to claim 1, further comprising:
   an input terminal configured to be connected to the external system and receive the expected reference voltage from the external system;
   an output terminal configured to exist on an output path to the external system; and
   a determination result output driver configured to receive the check result as a determination signal and output the determination signal to the output terminal.

5. The semiconductor apparatus according to claim 1, wherein the semiconductor apparatus is configured to receive the expected reference voltage by sharing an input terminal to which a reference voltage for command is inputted.

6. The semiconductor apparatus according to claim 5, further comprising an input selection unit which is configured to supply the reference voltage determination unit with the expected reference voltage which is applied to the input terminal or supply the internal command generation unit with the reference voltage for command which is applied to the input terminal, according to a test enable signal.

7. The semiconductor apparatus according to claim 4, wherein the semiconductor apparatus is configured to output the determination signal by sharing the output terminal through which internal data is outputted.

8. The semiconductor apparatus according to claim 7, further comprising a determination result output driver which is configured to output the check result or the internal data to the output terminal according to a test enable signal.

9. A method for checking a reference voltage, comprising:
   transmitting a generation code and an expected reference voltage from a first device to a second device;

generating by the second device a reference voltage according to the generation code;
comparing by the second device the expected reference voltage with the reference voltage; and
transmitting a comparison result from the second device to the first device,
wherein comparing the expected reference voltage with the reference voltage comprises: setting by the second device a target range in response to the generation code; and checking whether the expected reference voltage is in the target range, and
wherein setting the target range includes selecting two of the plurality of reference voltages.

10. The method according to claim 9, wherein generating the reference voltage comprises:
generating a plurality of reference voltages; and
selecting one of the plurality of reference voltages according to the generation code and outputting as the reference voltage.

11. The method according to claim 9, wherein the two comparison voltages are a minimum comparison voltage, which is larger than the reference voltage, and a maximum comparison voltage, which is smaller than the reference voltage, among the plurality of reference voltages.

* * * * *